United States Patent [19]

Dubble

[11] 3,934,063

[45] Jan. 20, 1976

[54] FLAME MASKING OF GLASS ARTICLES FOR METAL OXIDE FILM DEPOSITION

[75] Inventor: Roger D. Dubble, Lancaster, Ohio

[73] Assignee: Anchor Hocking Corporation, Lancaster, Ohio

[22] Filed: May 31, 1974

[21] Appl. No.: 475,288

[52] U.S. Cl. ................. 427/223; 427/226; 427/282
[51] Int. Cl.² ........................ B05D 3/08; B05D 1/32
[58] Field of Search ............ 117/46 FC, 46 FA, 94; 65/60; 118/47; 427/223, 226, 282, 65, 118

[56] References Cited
UNITED STATES PATENTS

| | | | |
|---|---|---|---|
| 1,673,624 | 6/1928 | Howe | 118/47 X |
| 3,438,803 | 4/1969 | Dubble et al. | 65/60 X |
| 3,498,819 | 3/1970 | Lyle et al. | 117/46 FC |
| 3,623,854 | 11/1971 | Frank | 65/60 X |
| 3,658,304 | 4/1972 | Hall et al. | 117/94 X |

Primary Examiner—William D. Martin
Assistant Examiner—Stuart D. Frenkel
Attorney, Agent, or Firm—Wood, Herron & Evans

[57] ABSTRACT

A method of selectively applying to an accurately bounded surface area on a glass article, an abrasion resistant metal oxide film of a compound of the type which is pyrolysible on contact with a hot glass surface to form the oxide. With the article at temperature effective for pyrolysing the compound, the portion of the article surface which is not to be coated is masked, or alternatively is curtained off, by a flame while other areas of the article are contacted by vapor of the compound. These two steps are carried out simultaneously. The flame prevents the metal oxide coating from forming on the article in the area isolated by the flame.

14 Claims, 3 Drawing Figures

U.S. Patent    Jan. 20, 1976    3,934,063
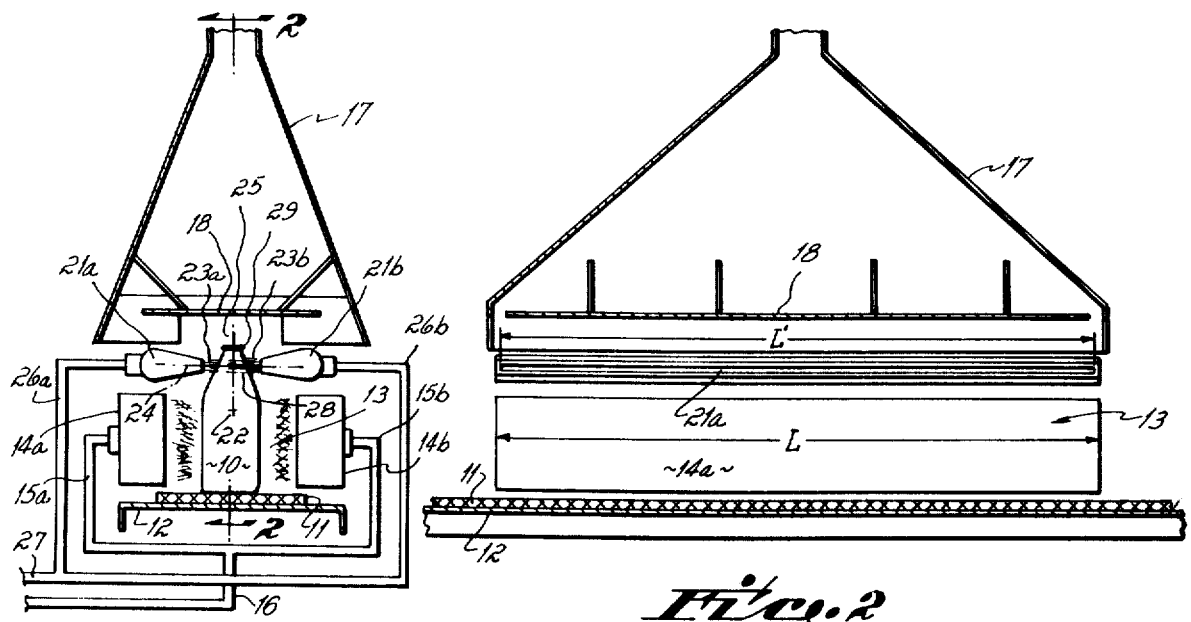
Fig. 1
Fig. 2
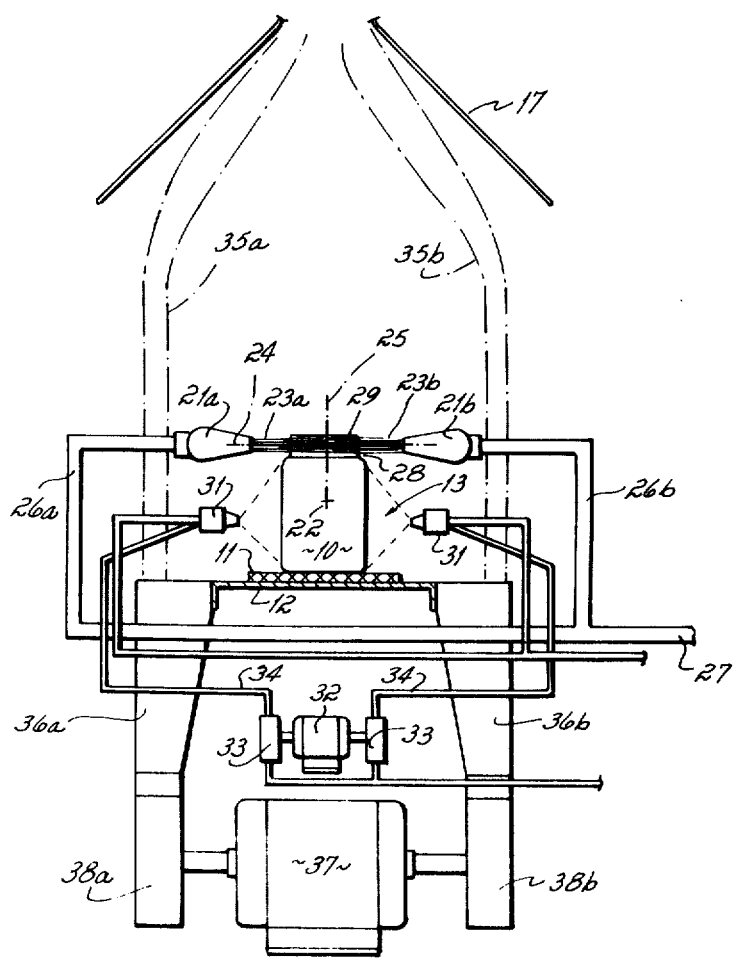
Fig. 3

FLAME MASKING OF GLASS ARTICLES FOR METAL OXIDE FILM DEPOSITION

BACKGROUND OF THE INVENTION

This invention relates to applying abrasion resistant metal oxide coatings to glass articles. More particularly, the invention relates to a method for preventing such coatings from being deposited on surface areas of the article where they are not wanted.

It is known that the abrasion resistance of glass articles, especially glass containers, can be significantly enhanced by forming a film on the glass surface of various pyrolysible metal compounds. Such coatings are commonly referred to in the industry as "oxide coatings", although they may not in fact be oxides and their exact chemistry is not understood. They are widely used in the commercial production of glass containers such as bottles, jars and the like.

It is well known that such a coating can be applied by contacting a glass container with vapor of various thermally decomposable or pyrolytic metal compounds while the glass article is at an elevated temperature that is sufficient to decompose the compound to form the oxide coating. This causes a film deposit to form on the glass surface which displays the enhanced scratch and abrasion resistance qualities. In one example of the usual practice, a bottle or jar at a temperature of about 700° to 1300° F. is exposed to and contacted by a vapor of a pyrolytic titanium compound such as tetraisopropyl titanate or titanium tetrachloride. At this temperature the vapor decomposes or pyrolyzes where it contacts the hot glass surface to form the film coating on the surface. The resulting film, which is very thin and almost invisible in ordinary light, is commonly referred to as a "$TiO_2$", "oxide" or "titanate" film, although its exact composition is difficult to determine and is not known precisely. This coating enhances the resistance of the bottle to the abrasion which it inevitably experiences in manufacture, filling and use. Typical of the patent art disclosing the general method of forming abrasion resistant oxide coatings with various pyrolytic titanium or tin compounds are the U.S. patent to Deyrup, U.S. Pat. No. 2,831,780; Dubble et al., U.S. Pat. No. 3,438,803; and Scholes U.S. Pat. No. 3,420,693. Pyrolytic compounds of zirconium, and other metals are also well known for this purpose, and reference may be had to the art for detailed descriptions of such compounds and methods.

It is frequently desirable or necessary to coat the hot glass surface selectively, especially in connection with glass containers which are adapted to receive foodstuffs, e.g., baby food jars, beer or soft drink bottles, and the like, so as to prevent deposition of the film on the finish (or cap-engaging) area, as well as on the interior of the container. This is so because metal oxide coatings under certain conditions may have an adverse effect on some of the sealing characteristics of jars and bottles when metal caps are applied. In particular, metal oxide coatings may in some cases produce low seal security and high removal torque. These problems can be minimized by preventing the deposition of such coatings on the finish area of glass containers which are to receive such caps. It is also, of course, desirable to prevent deposition of the coating film on the interior of glass containers intended for foodstuffs, where the film might be in contact with foodstuffs therein. While deposition on the interior surface of narrow necked bottles such as beer bottles or soft drink bottles is not a severe practical problem, deposition on the inside of wide-mouth bottles such as baby food jars does present a potential problem without the method of this invention.

One method known to the prior art for controlling coverage of such metal oxide films on glass articles makes use of an air stream which is intended to sweep the treating compound vapor away from that area where the coating is not desired, e.g., the finish area and the inside surface area of a container, the objective being physically to remove the vapor before it contacts that area so that actual contact of the vapor with that area is prevented. This method may use dry or wet air. If dry air is used, the air simply mechanically sweeps the vapor away from the selected area prior to contact. Moisture or water vapor in the air stream tends to react with the treating compound, so as to deactivate it. Typical apparatus adapted to carry out that method is described in U.S. Pat. No. 3,690,289.

However, it is difficult to control the action of such a sweep-away air stream, because relatively high air velocities are required to insure that the thermally decomposable compound vapor will in fact be eliminated from that area where the coating is not desired, which makes it difficult to control the boundary of the selected area. Secondly, a relatively cool air stream is undesirable from the standpoint of avoiding a detrimental temperature differential between the different areas of the glass article, i.e., between the finish and body. Although hot air streams may be utilized, that adds to the expense of the air stream method. Third, it is difficult for a line operator to determine exactly where the air stream is impinging on the glass article, and the operator must more or less guess as to the proper positioning of the nozzle which directs the air stream against the glass article, for no visual indicia is available on line to indicate just where the air stream is impinging on that glass article and where the edge of the coated area is.

It has been the principal objective of this invention to provide a masking method for use where pyrolytic metal oxide films are being applied, which is easily controlled under production line circumstances, provides visual indicia to the operator for preventing the film from forming in those selected areas on the glass articles where it is not desired, and which provides a high order of masking for such areas.

BRIEF DESCRIPTION OF THE INVENTION

In accord with this objective, the hot glass article is brought into the presence of vapor of an abrasion resistant metal oxide film-forming compound which is decomposable at the temperature of the article to provide a film of enhanced scratch resistance. The portion of the article surface which is not to be coated is either curtained off or is blanketed in a flame which contains water vapor as a product of combustion, while the surface area to be coated is contacted by the treating compound vapor. These two steps are carried out simultaneously. The vapor may be a true gas, or it may be a spray of finely divided liquid droplets. Where the flame contacts the treating compound vapor, it interacts with the compound in a manner that deactivates it and prevents the coating from forming on the article in those areas which the flame blankets or curtains.

Lyle U.S. Pat. No. 3,498,819 discloses a process of producing a scratch resistant glass article that includes a step of enveloping a glass article with a yellow flame, but only after the article has already been coated with an abrasion resistant metal oxide. The flame alters the previously formed film, on the entire surface of the glass article; it does not mask or remove the coating of the metal oxide on the surface of the glass article. The bottle is thereby fire polished, and the average electric potential across the coating is said to be reduced.

Other objectives and advantages of this invention will be more apparent from the following detailed description taken in conjunction with the drawings in which:

BRIEF DESCRIPTION OF THE DRAWINGS

FIG. 1 is a vertical cross section illustrating the preferred embodiment of an apparatus adapted to carry out the method of this invention wherein the treating compound vapor is in gaseous form;

FIG. 2 is a longitudinal cross-section of the apparatus taken along line 2—2 of FIG. 1; and FIG. 3 is a vertical cross-sectional view, similar to FIG. 1, of another form of apparatus adapted to carry out the method of this invention, wherein the heating compound vapor is applied as an atomized liquid spray.

DETAILED DESCRIPTION OF THE INVENTION

The method of this invention is useful with metal compounds which are pyrolysible on contact with hot glass surfaces to form abrasion resistant films, and which are inactivated by contact with flame prior to forming the coating. Specific examples of useful compounds are titanium esters and halides (e.g., tetraisopropyl titanate, tetrabutyl titanate, titanium lactate and titanium tetrachloride). It is also useful with other pyrolysible metal chemicals which are rendered inert by flame temperature oxidation and/or water vapor reaction, (e.g., dimethyl tin dichloride and tetra-n-propyl zirconate).

The method contemplates passing a glass article, e.g., a glass container such as a bottle, through the vapor (whether gaseous or atomized liquid droplets) of such a thermally decomposable compound, the metallic oxide coating being formed on the contacted surfaces of the article by thermal decomposition. It is the essence of the method improvement of this invention to subject that portion or area of the glass article surface which is not to be coated, to a gas flame during exposure of the article to the glass treating compound vapor. That is, the area of the glass article not to be coated is bathed in or curtained off by a gas flame at the same time as, and during essentially the entire time that, adjacent portions of the glass article are exposed to and contacted by the treating compound vapor. The surface region of the glass article thus bounded by the gas flame is that region on which the metal oxide scratch resistance coating is not desired.

Without intending to be limited to a particular theory of operation, it is believed that the heat and water vapor formed as a product of combustion in the flame, is very highly reactive with the treating compound so that it deactivates the compound and thereby prevents the compound from reacting on those areas where the metal oxide coating is not desired. An inert or unreactive dust or powder is sometimes observed to settle on the glass article's surface in those selected areas, under the flame, but it is not adherent and can be easily washed off subsequently.

The temperature of the gas flame which is most useful in accordance with this invention must be high enough that it will deactivate the chemical, yet not so high as to cause weakening or softening of that portion of the glass article to which it is directed. If a vapor treatment (as shown in FIG. 1) is employed, a soft yellow flame is desirable, to envelope the finish but not overheat the glass. If, on the other hand, the more violent turbulence associated with a spray application (as shown in FIG. 3) is used, then a sharp or "stiff" flame is desirable to overpower the spray blast. In this latter case the short exposure time in the high temperature sharp flame does not detrimentally increase the finish temperature. Flame temperatures as low as 1200° F., as indicated by the yellow sooty flame of the ribbon burners, up to the 2400°–2600°F. temperatures believed to occur in some burners, will provide the range of shielding required for the various application conditions encountered. The flame characteristics for a soft or yellow flame (as used for the ribbon burners, FIG. 1) can best be achieved with an air/gas ratio between roughly about 9:1 and 10:1 for natural gas; the ratios will vary according to the nature of the combustible gas used. Air/gas ratios above this range may cause the flame to be too lean a mixture to avoid "blowing out" and air/gas ratios below this range may cause the flame to be too unstable in its pattern to be an effective shielding medium. In the case of the internal combustion burner of FIG. 3, the mixture should best be close to a 10:1 ratio (for natural gas) to make the burner operate most effectively.

Generally speaking, any hydrocarbon gas or other water vapor producing combustible material can be used, although the optimum gas/air ratios will differ in each case. Typical combustible gases which are useful include natural gas, manufacturers' gas, propane, ethane, ethylene, and other petroleum hydrocarbon gases and producer gas ($H_2+CO$). The primary requirement of the combustible gas is that it produces heat and water vapor as a product of combustion. This heat and/or water vapor is believed to react with the treating compound so as to deactivate it before it can react on the glass surface to form the coating in an undesired location on the article. Some compounds are "resistant" to flame deactivation at certain conditions. This can readily be determined in advance by a simple test, exposing the article to the compound, under flame. The method is not useful where such compounds must be used.

A preferred structural embodiment for carrying out the method of this invention when a coating is being applied from a gaseous vapor is illustrated in FIGS. 1 and 2. As shown in those figures, glass articles or containers comprising non-returnable beer bottles 10 are arranged in linear relation on a moving conveyor belt 11, the conveyor belt being supported on a suitable guide 12 supported by conventional means not shown. The glass containers 10 pass through a treating area generally at 13 where they are exposed to and contacted by vapor of the treating compound. This treating environment 13 is established between vapor discharge chambers 14a, 14b in the form of plenums disposed on each side of the conveyor belt 11, opposite one to the other throughout a selected distance L of belt movement. Each plenum chamber 14a, 14b is supplied with the vapor from a vapor source (which may be conventional and does not comprise the invention) through piping 15a, 15b, 16 that interconnects the vapor source with each of the plenums An exhaust hood 17, a suitable fan (not shown) and exhaust ductwork (not shown) are disposed above the vapor manifold to exhaust unused or reacted treating vapors from the treating environment 13. A tunnel ceiling or baffle 18 is disposed immediately above the glass articles passing through the treating environment 13 to provide for optimum contact of the treating vapor with the glass articles 10 while retaining exhaust flow efficiency. A typical method and means for vapor generation which may be used in conjunction with the method of this invention is illustrated in Dubble et al. U.S. Pat. No. 3,438,803.

As is shown particularly in the figures, gas flame genorators in the form of so-called "ribbon" burners 21a, 21b, are disposed on each side of and parallel to the glass containers' travel path 22 through the tunnel. Ribbon burners produce a relatively thin flat flame, rather than a round flame, and each ribbon burner 21a, 21b is disposed so as to direct the gas flame 23a, 23b transverse to the travel path of the glass container throughout the length L of the vapor processing environment 13. Each ribbon burner is of a length L' approximately equal to the length L of the tunnel's vapor treating environment 13. The burners 21a, 21b are further disposed relative one to the other so that the gas flames 23a, 23b issue in substantially coplanar relation (see center line 24) from opposite sides of the travel path 22, and so that the gas flames impinge on one another in the travel plane 25 of the glass bottles 10. Thus the ribbon forms a horizontal plane or curtain, parallel to the articles' line of travel. The gas burners 21a, 21b are, of course, fed with a suitable air/gas mixture through piping 26a, 26b, 27 which interconnects with the gas and air sources (not shown). Suitable ribbon type burners are those manufactured by Selas Corporation of America, Dresher, Pennsylvania 19025; a particular Selas burner which has been used successfully is Series No. RB 322A which can provide a ribbon flame length of between about six inches and about seventy-two inches, depending on the length L of the vapor processing environment 13 itself.

As illustrated in FIG. 1, the gas flames 23a, 23b or flame tongues that issue from oppositely disposed ribbon burners 21a, 21b impinge on one another and the finish area 28 of the glass bottles 10 just beneath each bottle's upper lip 29. As is readily apparent from the figure, this provides a relatively exact visual indication to the machine operator as to the location of the masked area where the metal oxide deposition will not be formed, because of the visibility of the gas flames 23a, 23b. Deposition of the metal oxide above the gas flame's plane 24, i.e., above the flames, is prevented because the flames 23a, 23b act as a curtain barrier to the compound and deactivate the compound wherever they contact it, so that if any vapor passes through the flame to the upper side thereof it no longer has a glass reactive capacity. Thus, it is not necessary to bathe in flame the entire area which is to be kept free of coating; a curtain of flame at the edge of that area will deactivate the compound which may pass through it to the glass on the opposite (upper) side of the flame.

An alternative apparatus embodiment is illustrated in FIG. 3 (like numbers referring to like parts), this embodiment operating as described above for that embodiment shown in FIGS. 1 and 2 with the modifications described immediately hereafter. In that figure, the structure is adapted to carry out the method of this invention as previously described. However, the thermally decomposable treating compound vapor is an atomized liquid spray, as contrasted with the gaseous vapor in the embodiment first described. Spray heads 31 are disposed in the treating environment 13, the spray heads being fed from motor 32 driven micrometering type chemical feed pumps 33 through lines 34. This apparatus embodiment is further characterized by air curtains 35a, 35b which extend parallel to the travel plane 25 of the glass bottles 10 throughout the length L of the treating environment 13 and which extend from beneath the conveyor's belt 11 up to the hood 17. The air curtains 35a, 35b are formed in and fed by plenums 36a, 36b disposed beneath each. Electric motor 37 drives blowers 38a, 38b which, in turn, feed the plenums 36a, 36b for the side wall air curtains. The side wall air curtains, of course, insure that no vapors or spray particles will escape from the environment surrounding the device, and that all such particles are carried upwardly into the exhaust hood.

Note that the flames 23a, 23b are directed across the open mouth of wide mouth jars being subjected to the method; they function to prevent entry of the active treating vapors into the jars' interiors and, thereby, prevent deposition of the coating on the jars' interior surfaces as well as on the finish areas surrounding the top or lip areas of the jars.

The following examples illustrate the various ways of setting the invention into practice.

EXAMPLE I

A series of glass bottles (each about seven and one-half inches in height) was passed through a vapor coating device of the structure illustrated in FIG. 1 at a rate of 140 bottles per minute. The vapor used was titanium tetrachloride, and the scratch resistant coating so formed was believed to be titanium oxide. The vapor treating environment was of about thirty inches in length L. A Selas RB 322A burner was used, that burner presenting a ribbon flame of about 30 inches in length.

The gas flames were disposed so that a cut off of the titanate coating was obtained about one and one-half inches down from the tops of the bottles. A soft brush-type yellow flame was used to obtain this cut off point; the flame had a temperature of about 1400° F, an air/gas ratio of 9.5:1, and a velocity of about 2 feet/sec. By increasing the volume of air/gas mixture thru the burner so as to increase the velocity of the flame to about 4 feet/sec. the cut off was lowered to about four inches beneath the top of the bottle without changing the position of the burner; this was due to a "splatter" effect which is believed to tend to force the flame and hot products of combustion down the neck of the bottle upon impact of the flame with the bottle, and thereby widen the zone of reaction with the vapor.

The titanate coating established on the exterior surface of the bottle when the soft yellow flame was used was approximately measuring 1650 A units thick on the mid-side wall of the bottle. (This was much heavier than would ordinarily be desired, but was applied in order to determine masking effectiveness.) A metal oxide coating thickness of 400–450 A units was indicated about three-quarters inch beneath the cut off line when the soft brush-type flame was used. Substantially no titanium dioxide coating was detected on those parts of the bottle that were above the horizontal plane produced by the burner flame as the bottle traveled thru the treatment system. The sharp drop in metal oxide coating so closely adjacent the flame line, on heavily coated bottles, and the virtual absence of coating at or above the flame line, indicates the effectiveness of the system, even in an exaggerated system. Under normal conditions the vapor concentration is set much less, to apply a coating in the range of about 20–100 A.

EXAMPLE II

A series of 8 oz. baby food jars were passed through a spray device of the structure illustrated in FIG. 2 at a rate of 160 bottles per minute. The spray used was liquid tetraisopropyl titanate (TPT) droplets. This type jar presents a critical situation because of the spray gun-created turbulence within the treating environment, plus the need for a relatively sharp or precise cut off just below the finish. The burner used was the Selas Super Heat Burner No. SH 4FF, which provided a ribbon flame of about ¾ to 2 inches in length. This burner provides a strong flame barrier that overpowers the gun spray pattern in the bottles' finish area throughout the length of the treating environment. The flame's "stingout" temperature range was about 2000° to 2800° F., the air/gas ratio 10:1, with velocities of up to 600 ft./sec. Two spray nozzles, each discharging about 1 to 3 cc per minute of the tetraisopropyl titanate, were on each side of the treating environment's length of 2 inches. The spray nozzles were placed one above the other, 1½ inches apart with the bottom gun 1½ inches above the conveyor.

Under these processing conditions, the finish area of the jars received a titanate coating of between zero to five angstroms in thickness, which was acceptable with a coating level on the body portion of the jar being 18–80 angstroms. The interior surface area of the jars received no detectable coating.

Having described in detail the preferred embodiment of my invention, what I desire to claim and protect by Letters Patent is:

1. A method of coating a selectively limited surface area of a glass article with an abrasion resistant metal oxide coating, comprising the steps of:
   contacting the article with vapor of a metal compound which is pyrolysible to form an abrasion resistant metal oxide coating on the glass surface,
   the said article during said contacting being at a temperature effective to cause said compound to pyrolyze on its surface and form said coating thereon, simultaneously isolating that portion of the article's surface area which is not to be coated, by a flame in which water vapor is produced as a product of combustion, the flame being directed on the article so that the flame acts as a barrier between the compound and the area not to be coated,
   the flame barrier interacting with the compound, where the compound comes into contact with it, to deactivate the compound and render it inactive to react with said glass surface and thereby prevent said oxide coating from forming on the surface not to be coated.

2. The method of claim 1 wherein said compound is a titanium compound.

3. The method of claim 1 wherein said compound is titanium tetrachloride.

4. The method of claim 1 wherein said compound is tetraisopropyl titanate.

5. The method of claim 1 wherein said flame is produced by combustion of a hydrocarbon gas.

6. The method of claim 1 wherein said flame is produced by combustion of natural gas.

7. The method of claim 1 wherein the flame is a soft yellow flame.

8. The method of claim 1 wherein said article is a glass container having a finish portion which is not to be coated,
   and said flame is played only on the finish area thereof.

9. The method of claim 1 wherein said flame is in the form of a curtain interposed between said composition and the area not to be coated.

10. The method of claim 1 wherein said flame is a mask covering the entire area not to be coated.

11. The method of claim 1 wherein said article is moved along a path past a source of said compound while being contacted with said compound,
    and said flame is projected from ribbon burners on said article as a ribbon parallel to the path of movement of said article, and forms a horizontal mask for the area not to be coated.

12. The method of claim 1 wherein the vapor of the compound is a spray of finely divided liquid droplets.

13. The method of claim 1 wherein the vapor of the compound is a gaseous vapor.

14. A method of applying an abrasion resistant metal oxide coating on the sidewalls of glass containers moving on a conveyor while effectively preventing the formation of coating on the finish areas of the containers, comprising,
    moving the articles past a source of vapor of a compound which is pyrolysible to form an abrasion resistant metal oxide coating on the glass surface,
    said vapor being directed from said source toward the sidewalls of said containers while they are moving therepast,
    said containers being at a temperature effective to cause said compound to pyrolyze on their surfaces,
    while isolating the finish portions of the respective containers during said contacting, by simultaneously moving the containers through a flame barrier impinging on the finish portions thereof, the flame containing water vapor as a product of combustion, the flame being directed with respect to the articles moving past it so that said vapor can reach the finishes of the containers only after having come through said flame,
    the flame interacting with the compound adjacent the finishes and deactivating the compound thereby to render the compound inactive to react with said glass surface at the finishes only, and thereby prevent said oxide coating from forming on the finishes of the articles.

* * * * *